(12) United States Patent
Peng et al.

(10) Patent No.: US 10,951,191 B1
(45) Date of Patent: Mar. 16, 2021

(54) LOW-LEAKAGE AUTOMATIC ADJUSTABLE DIPLEXER

(71) Applicant: Universal Microwave Technology, Inc., Keelung (TW)

(72) Inventors: Jen-Ti Peng, Keelung (TW); Chien-Chih Lee, Taipei (TW); Cheng-Lung Wu, New Taipei (TW); Meng-Hung Hsieh, New Taipei (TW); You-Hua Wu, Hsinchu (TW)

( * ) Notice: Subject to any disclaimer, the term of this patent is extended or adjusted under 35 U.S.C. 154(b) by 0 days.

(21) Appl. No.: 16/726,848

(22) Filed: Dec. 25, 2019

(51) Int. Cl.
| | |
|---|---|
| *H04B 1/40* | (2015.01) |
| *H04B 1/04* | (2006.01) |
| *H04B 1/16* | (2006.01) |
| *H03H 7/46* | (2006.01) |
| *H01P 1/208* | (2006.01) |
| *H03H 7/01* | (2006.01) |

(52) U.S. Cl.
CPC ............. *H03H 7/465* (2013.01); *H01P 1/208* (2013.01); *H03H 7/17* (2013.01)

(58) Field of Classification Search
CPC .... H04B 1/525; H04B 17/354; H04B 1/0057; H04B 1/0067; H04B 1/04; H04B 1/16; H04B 1/40; H03H 7/465; H03H 7/17; H01P 1/208
See application file for complete search history.

(56) References Cited

U.S. PATENT DOCUMENTS

| | | | | |
|---|---|---|---|---|
| 8,552,809 | B2* | 10/2013 | Nealis | H01P 1/39 333/1.1 |
| 10,461,421 | B1* | 10/2019 | Tran | G06N 3/08 |
| 2003/0027530 | A1* | 2/2003 | Levitt | H04B 1/50 455/73 |
| 2012/0075041 | A1* | 3/2012 | Flynn | H01P 1/207 333/211 |
| 2013/0230270 | A1* | 9/2013 | Horn | G02F 1/3558 385/11 |
| 2016/0380331 | A1* | 12/2016 | Uemichi | H01P 5/182 333/110 |
| 2018/0034125 | A1* | 2/2018 | Ligander | H01Q 5/50 |
| 2020/0136584 | A1* | 4/2020 | Uemichi | H03H 7/0161 |

* cited by examiner

*Primary Examiner* — Andrew Wendell

(57) ABSTRACT

Provided is a low-leakage automatic adjustable diplexer including a body, a thin plate and two resonant regulators. The body has therein cuboid waveguide channels each having a feeding portion, a reception port portion, a transmission port portion, a fitting portion, a first filtering portion, a second filtering portion, first E/H conversion units connected to two ends of the first filtering portion, respectively, and second E/H conversion units connected to two ends of the second filtering portion, respectively. The thin plate is clamped inside the body. The resonant regulators each have a plurality of frequency disturbance elements adjustably protruding into the first and second filtering portions. Given the E/H conversion units and the frequency disturbance elements penetratingly disposed on the H-side sidewall of the cuboid waveguide cavity, it is unnecessary for the cuboid waveguide channels to undergo any processing process for forming therein any protrusion-style insulation walls, thereby attaining low leakage.

9 Claims, 4 Drawing Sheets

LOW-LEAKAGE AUTOMATIC ADJUSTABLE DIPLEXER

BACKGROUND OF THE INVENTION

Field of the Invention

The present disclosure relates to a diplexer and, more particularly, to a low-leakage automatic adjustable diplexer in the mobile-communication field.

Description of the Prior Art

In the mobile-communication field, a diplexer of an emitting/receiving system is an important waveguide device whereby signals are combined or separated into two signals which differ in frequency band.

Conventionally, a diplexer has therein a plurality of channels formed from a cavity structure. The channels have therein resonant channels capable of filtering. Therefore, the wall surface of the cavity must undergo a processing process to form raised structures which function as insulation walls and thus form a plurality of resonant cavities, so as to attain wave guiding and filtering.

However, the insulation walls formed on the cavity wall and protruded into the channels render the manufacturing process of the cavity structure complicated and lengthy, leading to an increase in the manufacturing cost and an increase in the weight of the diplexer. Owing to development and evolution of mobile communication technology, the required number of mobile communication base stations deployed is on the rise, and thus lightweight apparatuses meet deployment environment requirements. Furthermore, gaps on the cavity structure of the diplexer are often a cause of leakage of electromagnetic waves to the detriment of signal transmission precision.

SUMMARY OF THE INVENTION

It is an objective of the present disclosure is to simplify a cavity structure of a diplexer.

Another objective of the present disclosure is to reduce the manufacturing cost and weight of the diplexer.

Yet another objective of the present disclosure is to prevent leakage of electromagnetic waves from the diplexer.

In order to achieve the above and other objectives, the present disclosure provides a low-leakage automatic adjustable diplexer comprising a body, a thin plate and two resonant regulators.

The body comprises a first casing and a second casing which are in contact with each other. A graphical structure is concavely disposed on each of two contact sides of the first and second casings and forms a plurality of cuboid waveguide channels each having a feeding portion, a reception port portion for receiving waveguide signals, a transmission port portion for transmitting waveguide signals, a fitting portion connected to the feeding portion, a first filtering portion connected between the reception port portion and the fitting portion, a second filtering portion connected between the transmission port portion and the fitting portion, first E/H conversion units connected to two ends of the first filtering portion, respectively, and second E/H conversion units connected to two ends of the second filtering portion, respectively. The thin plate is clamped by and between the first casing and the second casing and comprises a first hollowed-out portion corresponding in position to the first filtering portion and a second hollowed-out portion corresponding in position to the second filtering portion. The two resonant regulators are disposed on two sides of the body, respectively, and each have a plurality of frequency disturbance elements adjustably protruding into the first and second filtering portions of the body, wherein each said frequency disturbance element penetrates an H-side sidewall of the corresponding cuboid waveguide cavity. In the cuboid waveguide channels in the body, a type-I E-side sidewall of the cuboid waveguide cavity defines the feeding portion, the reception port portion, the transmission port portion, and the fitting portion, and a type-II E-side sidewall of the cuboid waveguide cavity defines the first filtering portion and the second filtering portion, wherein the type-I E-side sidewall of the cuboid waveguide cavity and the type-II E-side sidewall of the cuboid waveguide cavity are perpendicular to each other.

In one embodiment, the first hollowed-out portion and the second hollowed-out portion each have a plurality of windows, and a coupling insulation band integrally formed with the thin plate is disposed between two adjacent ones of the windows in a waveguide direction, allowing the first filtering portion or the second filtering portion to be partitioned by the windows and the corresponding coupling insulation bands into a plurality of resonant cavities in the waveguide direction.

In one embodiment, on wall surfaces of the first and second casings, the type-II E-side sidewall and the H-side sidewall of the cuboid waveguide cavity of the first filtering portion and the second filtering portion are flat surfaces.

In one embodiment, the first filtering portion and the second filtering portion are disposed at an edge near the body, and an additional channel portion is disposed between one of the first filtering portion and the second filtering portion and the corresponding E/H conversion unit.

In one embodiment, the frequency disturbance elements each have a screw and a disk connected to an end portion of the screw.

In one embodiment, the resonant regulators each have a displacement regulation apparatus, a correction plate and the frequency disturbance elements, wherein another end of each said frequency disturbance element is connected to the correction plate, and the correction plate is connected to the displacement regulation apparatus.

Therefore, in an embodiment of the present disclosure, given the E/H conversion units and the frequency disturbance elements penetratingly disposed on the H-side sidewall of the cuboid waveguide cavity, it is unnecessary for the cuboid waveguide channels in the body of the low-leakage automatic adjustable diplexer to undergo any processing process for forming therein any protrusion-style insulation walls, so as to reduce the manufacturing cost and weight of the diplexer. Furthermore, the diameter of the screw is minimized to miniaturize a corresponding through hole on the body, and thus the frequency disturbance elements which pass through the H-side sidewall advantageously attain low leakage.

DETAILED DESCRIPTION OF THE EMBODIMENTS

The technical characteristics, contents, advantages and effects of the present invention will become apparent from the following detailed description taken with the accompanying drawing.

In the disclosure, descriptive terms such as "a" or "one" are used to describe the component, structure, devices, modules, systems, portions or regions, and are for illustration purposes and providing generic meaning to the scope of the present invention. Therefore, unless otherwise explicitly specified, such description should be understood as including one or at least one, and a singular number also includes a plural number.

In the disclosure, descriptive terms such as "include, comprise, have" or other similar terms are not for merely limiting the essential elements listed in the disclosure, but can include other elements that are not explicitly listed and are however usually inherent in the components, structures, devices, modules, systems, portions or regions.

In the disclosure, the terms similar to ordinals such as "first" or "second" described are for distinguishing or referring to associated identical or similar components, structures, devices, modules, systems, portions or regions and do not necessarily imply the orders of these components, structures, devices, modules, systems, portions or regions in a spatial aspect. It should be understood that, in some situations or configurations, the ordinal terms could be interchangeably used without affecting the implementation of the present invention.

Figure 1:
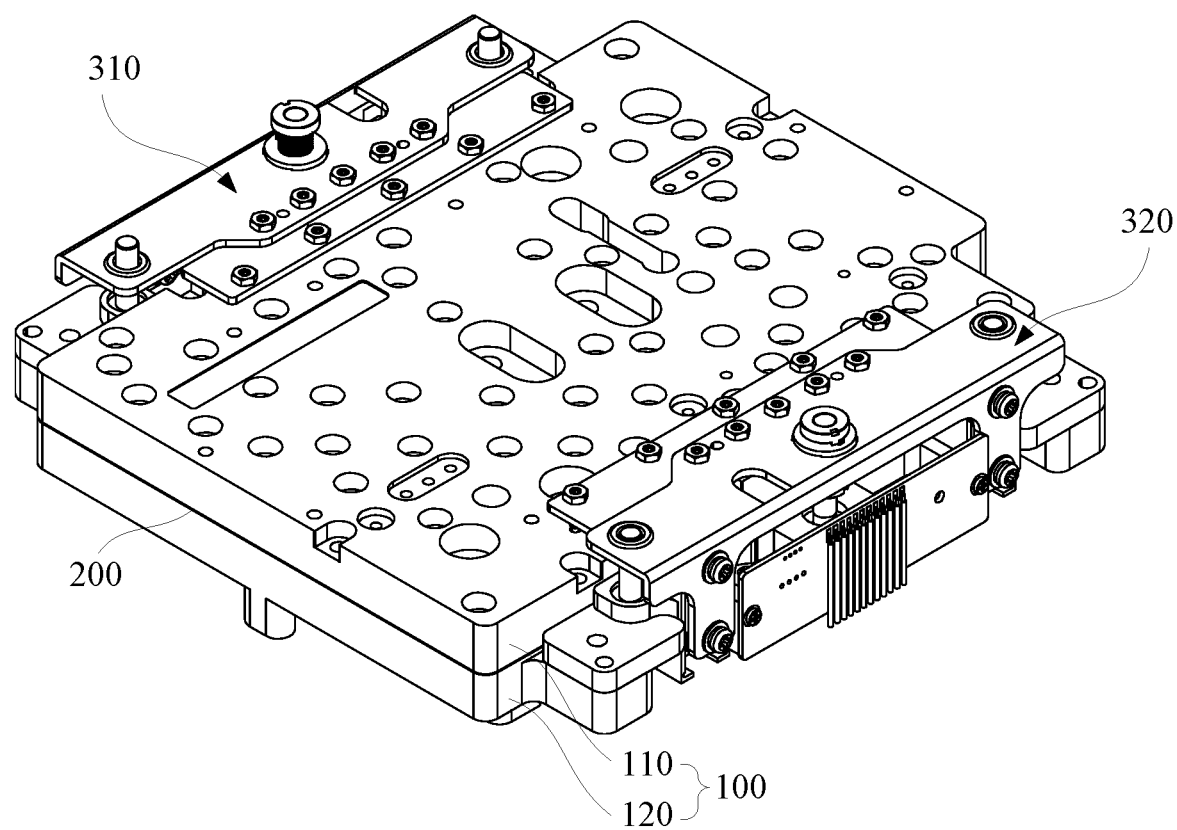
FIG. 1 is a perspective view of a low-leakage automatic adjustable diplexer according to an embodiment of the present disclosure.
Figure 2:
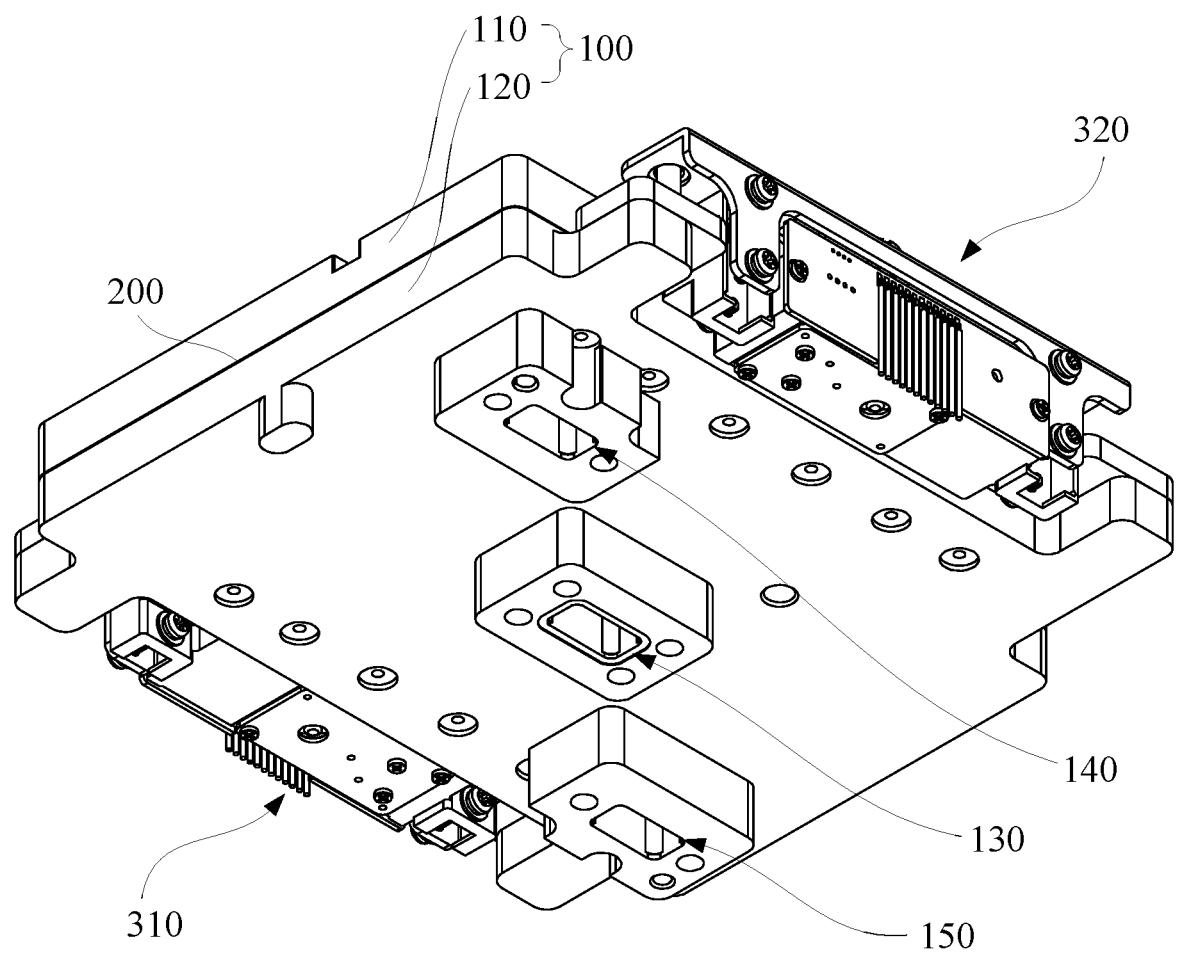
FIG. 2 is a perspective view of the low-leakage automatic adjustable diplexer shown in FIG. 1 but taken from another angle.

Referring to FIG. 1 and FIG. 2, there are shown perspective views of a low-leakage automatic adjustable diplexer taken from different angles according to an embodiment of the present disclosure. In this embodiment, the low-leakage automatic adjustable diplexer comprises a body 100, a thin plate 200 and two resonant regulators 310, 320.

The body 100 comprises a first casing 110 and a second casing 120 which are in contact with each other and thereby are coupled together. A plurality of cuboid waveguide channels is defined between the first casing 110 and the second casing 120. The thin plate 200 is clamped by and between the first casing 110 and the second casing 120.

A feeding port 130 for connecting to a back-end apparatus, a transmission port 140 for connecting to an antenna apparatus and transmitting waveguide signals, and a reception port 150 for connecting to the antenna apparatus and receiving waveguide signals are disposed on one side of the body 100. The feeding port 130, the transmission port 140, and the reception port 150 extend to the inside of the body 100.

The resonant regulators 310, 320 are disposed on two sides of the body 100, respectively, and adapted to provide the cuboid waveguide channels in the body 100 with disturbance energy required for frequency shift, thereby achieving regulation.

Figure 3:
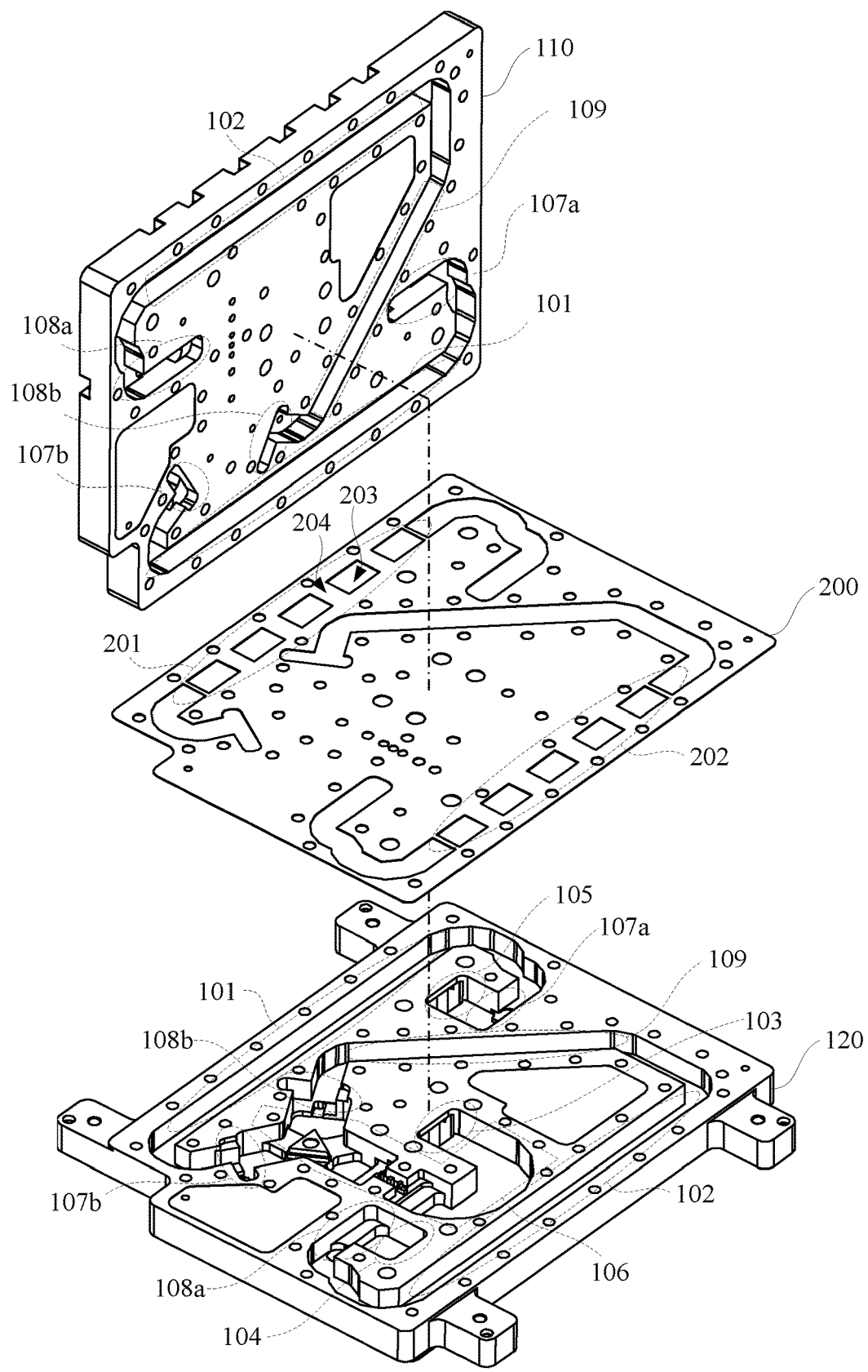
FIG. 3 is a schematic view of some components of the low-leakage automatic adjustable diplexer according to an embodiment of the present disclosure.

Referring to FIG. 3, there is shown a schematic view of some components of the low-leakage automatic adjustable diplexer according to an embodiment of the present disclosure. The components shown in FIG. 3 are the first casing 110, the second casing 120 and the thin plate 200.

As shown in FIG. 3, a graphical structure is concavely disposed on each of the two contact sides of the first and second casings 110, 120. When coupled together, the graphical structures form a plurality of cuboid waveguide channels in the body 100. The cuboid waveguide channels each have a feeding portion 103, a reception port portion 105 for receiving waveguide signals, a transmission port portion 104 for transmitting waveguide signals, a fitting portion 106 connected to the feeding portion 103, a first filtering portion 101 connected between the reception port portion 105 and the fitting portion 106, a second filtering portion 102 connected between the transmission port portion 104 and the fitting portion 106, first E/H conversion units 107a, 107b connected to two ends of the first filtering portion 101, respectively, and second E/H conversion units 108a, 108b connected to two ends of the second filtering portion 102, respectively.

Referring to FIG. 1 and FIG. 2, the feeding portion 103 is connected to the feeding port 130, the transmission port portion 104 to the transmission port 140, and the reception port portion 105 to the reception port 150.

The body 100 of the diplexer is a metallic case with a case wall. The case wall is made by casting and adapted to define a waveguide channel cavity. The stepped surface of the case wall constitutes specific transfer environment, and thus electromagnetic energy being transferred within the waveguide channel cavity can be precisely guided.

In the embodiment of the present disclosure, given the stepped surface of the case wall, the first E/H conversion units 107a, 107b and the second E/H conversion units 108a, 108b twist the electromagnetic energy being transferred within the waveguide channel cavity from the initial E-plane form to H-plane form, allowing the electromagnetic energy in H-plane form to pass through the corresponding filtering portion. Then, the filtered electromagnetic energy in H-plane form is twisted back to E-plane form to continue with subsequent transfer.

Therefore, regarding the first casing 110 and the second casing 120 in the embodiment of the present disclosure, as shown in FIG. 3, the position of E-side sidewall of the cuboid waveguide cavity of the first filtering portion 101 and the second filtering portion 102 is different from that of the feeding portion 103, the reception port portion 105, the transmission port portion 104, and the fitting portion 106. Therefore, the manufacturing and processing process of the first casing 110 and the second casing 120 is simplified, thereby dispensing with the need to form on the first casing 110 and the second casing 120 the insulation walls protruded into the first filtering portion 101 and the second filtering portion 102. Therefore, the graphical structures concavely disposed on the inner surface of the first casing 110 and the inner surface of the second casing 120 as well as E-side sidewall and H-side sidewall of the cuboid waveguide cavity of the first filtering portion 101 and the second filtering portion 102 are flat surfaces.

As shown in FIG. 3, the thin plate 200 comprises a first hollowed-out portion 201 corresponding in position to the first filtering portion 101 and a second hollowed-out portion 202 corresponding in position to the second filtering portion 102. The hollowed-out portions 201, 202 each have therein a plurality of windows 203. In the waveguide direction, an uninterrupted coupling insulation band 204 integrally formed with the thin plate 200 is disposed between two adjacent ones of the windows 203. In the waveguide direction, the two adjacent windows 203 and the corresponding coupling insulation band 204 allow the first filtering portion 101 and the second filtering portion 102 to be partitioned into a plurality of resonant cavities. The thin plate 200 is of a thickness of 0.15~0.25 mm conducive to satisfactory coupling insulation. Each said coupling insulation band 204 is parallel to H-side sidewalls of the first filtering portion 101 and the second filtering portion 102. Therefore, partition of the resonant cavities is defined by the coupling insulation bands 204 of the thin plate 200.

As shown in FIG. 3, the first filtering portion 101 and the second filtering portion 102 are disposed on edges near the body 100. An additional channel portion 109 is disposed between the second filtering portion 102 and the corresponding second E/H conversion units 108a, 108b. The additional channel portion 109 enables the second filtering portion 102 to extend to the edge near the body 100, but the present disclosure is not limited thereto. In a variant embodiment of the present disclosure, the additional channel portion 109 is disposed between the first filtering portion 101 and the corresponding first E/H conversion units 107a, 107b to enable the first filtering portion 101 to extend to the edge near the body 100.

Figure 4:
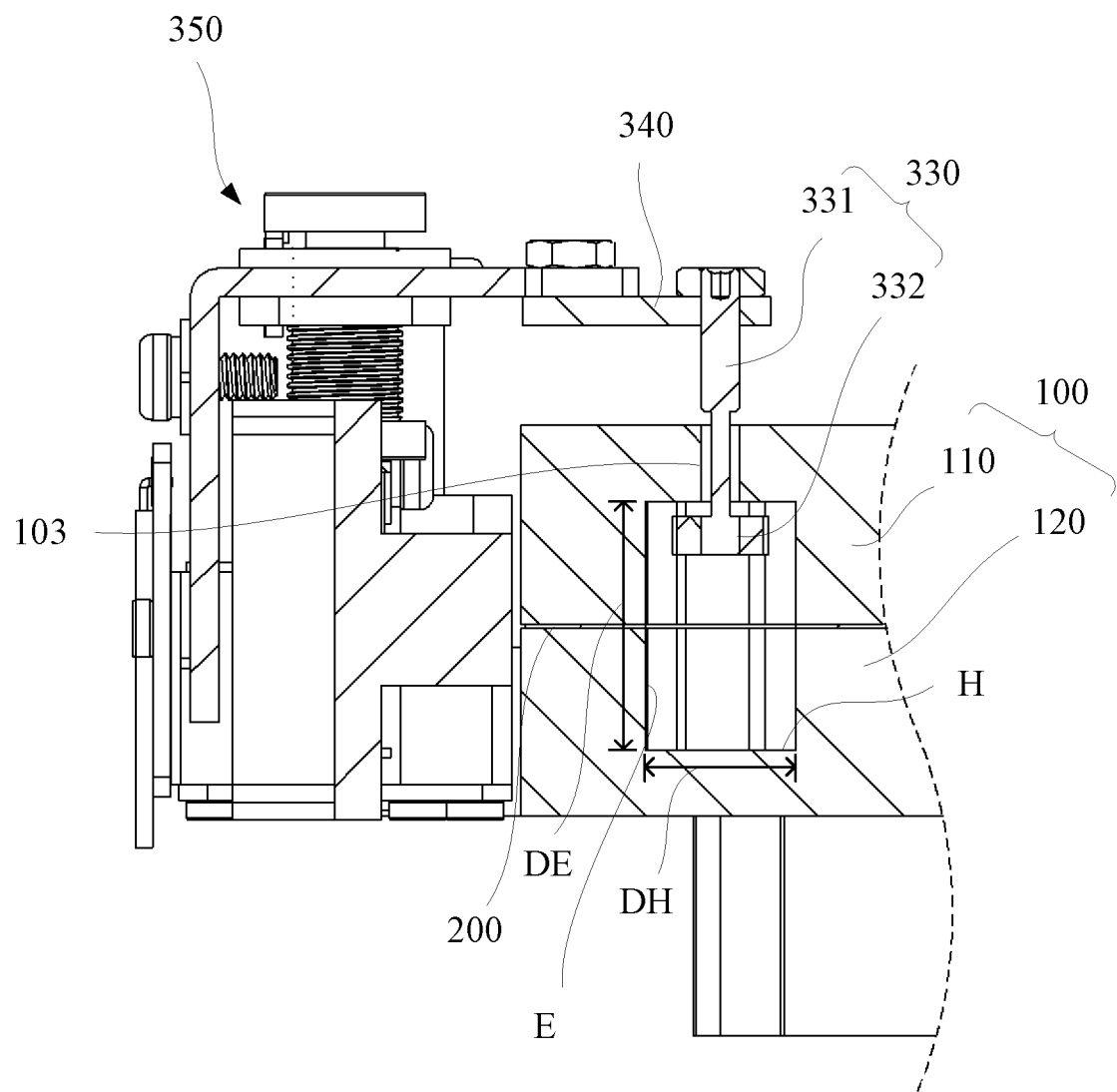
FIG. 4 is a partial cross-sectional view of the low-leakage automatic adjustable diplexer according to an embodiment of the present disclosure.

Referring to FIG. 4, there is shown a partial cross-sectional view of the low-leakage automatic adjustable diplexer according to an embodiment of the present disclosure. FIG. 4 is a cross-sectional view of the first and second filtering portions 101, 102 of the body 100, showing that frequency disturbance elements 330 adjustably protruding into the first and second filtering portions 101, 102 of the cuboid waveguide cavity in the body 100. The frequency disturbance elements 330 each have a screw 331 and a disk 332 connected to an end portion of the screw 331.

The disk 332 can be of any shape, though this embodiment is exemplified by a circular disk. Preferably, the disk 332 is of a diameter of 4.4~4.6 mm. Preferably, the screw 331 is of a diameter of 1.6~2.4 mm, and the shrinking portion of the screw 331 as shown in FIG. 4 is of a diameter of 0.9~1.1 mm.

The diameter of the screw 331 is minimized to miniaturize a corresponding through hole 103 on the body 100 and miniaturize gaps thereon, thereby attaining the low-leakage advantage. Furthermore, the disturbance is augmented by allowing the disk 332 to have a greater diameter than the screw 331 and allowing the H-side sidewalls to pass through the filtering portions. In the filtering portions of the body 100, width DH of the H-side sidewall H of the cuboid waveguide cavity is less than width DE of the E-side sidewall E of the cuboid waveguide cavity.

As shown in FIG. 1 and FIG. 4, the other end of the frequency disturbance elements 330 is connected to a correction plate 340. The correction plate 340 is connected to a displacement regulation apparatus 350. The frequency disturbance elements 330, the correction plate 340 and the displacement regulation apparatus 350 together constitute the resonant regulators 310, 320.

The displacement regulation apparatus 350 comprises a controlling module and a driving module to regulate the displacement of the correction plate 340 in the direction parallel to the E-side sidewalls in the filtering portions and thereby control the extent to which the disk 332 of the frequency disturbance elements 330 protrudes into the cuboid waveguide cavity. In general, the greatest possible depth of the protrusion of the frequency disturbance elements 330 is controllably set to be a midpoint. The midpoint is defined as the center of the thin plate 200 in the thickness direction. The correction plate 340 further functions as an interface between the frequency disturbance elements 330 and the displacement regulation apparatus 350, and thus the frequency disturbance elements 330 are precisely positioned at the through hole 103 on the body 100.

As shown in FIG. 4, the E-side sidewall E of the cuboid waveguide cavity, which defines the first filtering portion 101, is a type-II E-side sidewall, whereas the E-side sidewall (not shown) of the cuboid waveguide cavity, which defines the second filtering portion 102, is also the type-II E-side sidewall. The type-II E-side sidewall and a type-I E-side sidewall are perpendicular to each other. The type-I E-side sidewall is for transferring electromagnetic energy which is transmitted within the waveguide channel cavity and has not yet been twisted. As shown in FIG. 2, the type-I E-side sidewall is substantially parallel to the thin plate 200, whereas the type-II E-side sidewall is substantially perpendicular to the thin plate 200. The type-I E-side sidewall constitutes the E-side transmission wall of the cuboid waveguide cavity of the feeding portion 103, the reception port portion 105, the transmission port portion 104, and the fitting portion 106.

In conclusion, given the E/H conversion units and the frequency disturbance elements penetratingly disposed on the H-side sidewall of the cuboid waveguide cavity, it is unnecessary for the cuboid waveguide channels to undergo any processing process for forming therein any protrusion-style insulation walls, thereby dispensing with the processing process and reducing the weight of the diplexer. Furthermore, the frequency disturbance elements which pass through the H-side sidewalls and miniaturization of the screw are conductive to enhancement of the hermetic seal of the diplexer, thereby augmenting the low-leakage advantage.

While the invention has been described by means of specific embodiments, numerous modifications and variations could be made thereto by those skilled in the art without departing from the scope and spirit of the invention set forth in the claims.

What is claimed is:

1. A low-leakage automatic adjustable diplexer, comprising:
    a body comprising a first casing and a second casing which are in contact with each other, wherein a graphical structure is concavely disposed on each of two contact sides of the first and second casings and forms a plurality of cuboid waveguide channels including a feeding portion, a reception port portion for receiving waveguide signals, a transmission port portion for transmitting waveguide signals, a fitting portion connected to the feeding portion, a first filtering portion connected between the reception port portion and the fitting portion, a second filtering portion connected between the transmission port portion and the fitting portion, first electromagnetic energy conversion units connected to two ends of the first filtering portion, respectively, and second electromagnetic energy conversion units connected to two ends of the second filtering portion, respectively, wherein, each electromagnetic energy conversion units converts the electromagnetic energy of the signal input to the corresponding filtering portion from an original form to another form, and then converts the electromagnetic energy of the signal output from the corresponding filtering portion back to the original form, the original form is perpendicular to the another form;
    a thin plate clamped by and between the first casing and the second casing and comprising a first hollowed-out portion corresponding in position to the first filtering portion and a second hollowed-out portion corresponding in position to the second filtering portion; and two resonant regulators disposed on two sides of the body, respectively, and each having a plurality of frequency disturbance elements adjustably protruding into the first and second filtering portions of the body, wherein each said frequency disturbance element penetrates an H-side sidewall of the corresponding cuboid waveguide cavity, wherein, in the cuboid waveguide channels in the body, a type-I E-side sidewall of the cuboid waveguide cavity defines the feeding portion, the reception port portion, the transmission port portion, and the fitting portion, and a type-II E-side sidewall of the cuboid waveguide cavity defines the first filtering portion and the second filtering portion, wherein the type-I E-side sidewall of the cuboid waveguide cavity and the type-II E-side sidewall of the cuboid waveguide cavity are perpendicular to each other.

2. The low-leakage automatic adjustable diplexer of claim 1, wherein the first hollowed-out portion and the second hollowed-out portion each have a plurality of windows, and a coupling insulation band integrally formed with the thin plate is disposed between two adjacent ones of the windows in a waveguide direction, allowing the first filtering portion or the second filtering portion to be partitioned by the windows and the corresponding coupling insulation bands into a plurality of resonant cavities in the waveguide direction.

3. The low-leakage automatic adjustable diplexer of claim 2, wherein, on wall surfaces of the first and second casings, the type-II E-side sidewall and the H-side sidewall of the cuboid waveguide cavity of the first filtering portion and the second filtering portion are flat surfaces.

4. The low-leakage automatic adjustable diplexer of claim 3, wherein the thin plate is of a thickness of 0.15~0.25 mm.

5. The low-leakage automatic adjustable diplexer of claim 1, wherein the first filtering portion and the second filtering portion are disposed at an edge near the body, and an additional channel portion is disposed between one of the first filtering portion and the second filtering portion and the corresponding electromagnetic energy conversion units.

6. The low-leakage automatic adjustable diplexer of claim 1, wherein the frequency disturbance elements each have a screw and a disk connected to an end portion of the screw.

7. The low-leakage automatic adjustable diplexer of claim 6, wherein the screw is of a diameter of 1.6~2.4 mm.

8. The low-leakage automatic adjustable diplexer of claim 6, wherein the disk is circular and is of a diameter of 4.4~4.6 mm.

9. The low-leakage automatic adjustable diplexer of claim 6, wherein the resonant regulators each have a displacement regulation apparatus, a correction plate and the frequency disturbance elements, wherein another end of each said frequency disturbance element is connected to the correction plate, and the correction plate is connected to the displacement regulation apparatus.

\* \* \* \* \*